United States Patent
Schweitzer et al.

(10) Patent No.: US 6,452,114 B1
(45) Date of Patent: Sep. 17, 2002

(54) PLUG-IN CIRCUIT BOARD WITH REDUCED INSERTION FORCE

(75) Inventors: Theodore A. Schweitzer, Fairfax, VA (US); Norman S. Saah, Rockville, MD (US); Paul H. Bock, Jr., Hamilton; Dmitry H. Levitan, Fairfax, both of VA (US)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 09/663,339

(22) Filed: Sep. 15, 2000

Related U.S. Application Data

(60) Provisional application No. 60/154,320, filed on Sep. 17, 1999.

(51) Int. Cl.⁷ .......................... H01R 12/04; H05K 1/11

(52) U.S. Cl. ......................................... 174/261; 439/59

(58) Field of Search .................... 174/255, 260, 174/261; 439/59–62

(56) References Cited

U.S. PATENT DOCUMENTS

| | | | |
|---|---|---|---|
| 2,797,337 A | 6/1957 | Hollins | 307/10 |
| 3,138,675 A | 6/1964 | Krone | 200/51.09 |
| 3,191,095 A | 6/1965 | Hefti | 317/9 |
| 3,369,088 A | 2/1968 | Knecht | 200/51.11 |
| 3,432,795 A | 3/1969 | Jayne | 339/17 |
| 3,518,612 A | 6/1970 | Dunman et al. | 339/19 |
| 3,973,817 A | 8/1976 | Stalley et al. | 339/14 |
| 3,993,935 A | 11/1976 | Phillips et al. | 317/101 |

(List continued on next page.)

FOREIGN PATENT DOCUMENTS

| | | |
|---|---|---|
| GB | 1197299 | 7/1970 |

OTHER PUBLICATIONS

IBM Technical Disclosure Bulletin, vol. 31, No. 10, pp. 284–285, Mar. 1989.
Pulsecom, BBF1B Quad DS1, DDM–2000/SLC–2000 Circuit Pack, Data Sheet, Jul. 1999.
Pulsecom, BBF3, Quad DS1 Extension Unit, Product Bulletin, Aug. 1997.
Photographs for Pulse Communications, Inc. BBF1B line card.
Dual–Level Printed Circuit Board Edge Connector, Reproduced from Research Disclosure, Aug. 1987, No. 280, Kenneth Mason Publications Ltd., England.

*Primary Examiner*—Kamand Cuneo
*Assistant Examiner*—Jeremy Norris
(74) *Attorney, Agent, or Firm*—John E Holmes; Alfred N Goodman

(57) ABSTRACT

A plug-in circuit board assembly requires reduced insertion force during connection to a plurality of shorting contacts in a socket or receptacle. The connector portion of the circuit board assembly has a pair of end sections with beveled insertion edges that extend substantially perpendicular to the insertion direction of the circuit board. A shallow V-shaped cut-out with non-beveled insertion edges is located between the end sections. Electrically conductive fingers are carried by the connector portion of the circuit board assembly and extend toward the insertion edges of the end sections and V-shaped cut-out. The electrically conductive fingers adjoining the V-shaped cut-out are positioned to make contact with shorting contacts in the socket or receptacle, while the electrically conductive fingers of the beveled end sections are positioned to make contact with conventional (non-shorting) contacts in the socket or receptacle. The angled insertion edges of the V-shaped cut-out cause the electrically conductive fingers adjoining the cut-out to make contact with the shorting contacts in a sequential or progressive manner when the circuit board assembly is inserted into the socket or receptacle, thereby reducing the insertion force that would otherwise be encountered due to the absence of a bevel on the insertion edges of the cut-out

17 Claims, 8 Drawing Sheets

U.S. PATENT DOCUMENTS

| | | | |
|---|---|---|---|
| 4,037,186 A | 7/1977 | Palmer et al. | 335/206 |
| 4,070,557 A | 1/1978 | Ostapovitch | 200/51.1 |
| 4,106,841 A | 8/1978 | Vladic | 339/176 |
| 4,179,178 A | 12/1979 | Bachman et al. | 339/111 |
| 4,333,696 A * | 6/1982 | O'Neill et al. | 339/17 LM |
| 4,438,303 A | 3/1984 | Astier | 200/51.1 |
| 4,507,697 A | 3/1985 | Ozil et al. | 361/1 |
| 4,510,553 A | 4/1985 | Faultersack | 361/413 |
| 4,514,030 A | 4/1985 | Triner et al. | 339/176 |
| 4,549,036 A | 10/1985 | Reichbach | 174/52 |
| 4,614,877 A | 9/1986 | Knesewitsch et al. | 307/64 |
| 4,734,041 A | 3/1988 | Bruchmann et al. | 439/637 |
| 4,758,928 A | 7/1988 | Wierec et al. | 361/415 |
| 4,849,944 A | 7/1989 | Matsushita | 371/21 |
| 4,889,495 A | 12/1989 | Kimura | 439/60 |
| 4,927,382 A | 5/1990 | Huber | 439/490 |
| 4,952,758 A | 8/1990 | Dara et al. | 200/51.09 |
| 4,975,067 A | 12/1990 | Bastijanic et al. | 439/65 |
| 4,991,062 A | 2/1991 | Nguyenngoc | 361/424 |
| 5,066,240 A | 11/1991 | Verdun | 439/181 |
| 5,080,613 A | 1/1992 | Orui et al. | 439/660 |
| 5,088,931 A | 2/1992 | Niciolo et al. | 439/188 |

* cited by examiner

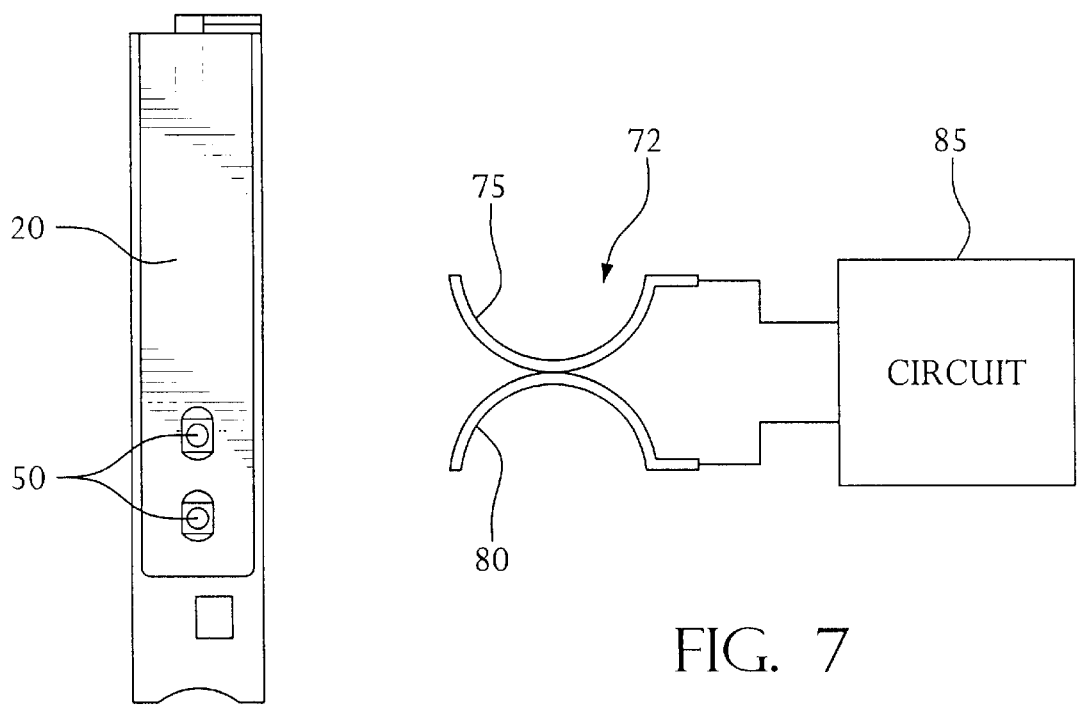
FIG. 3
FIG. 7
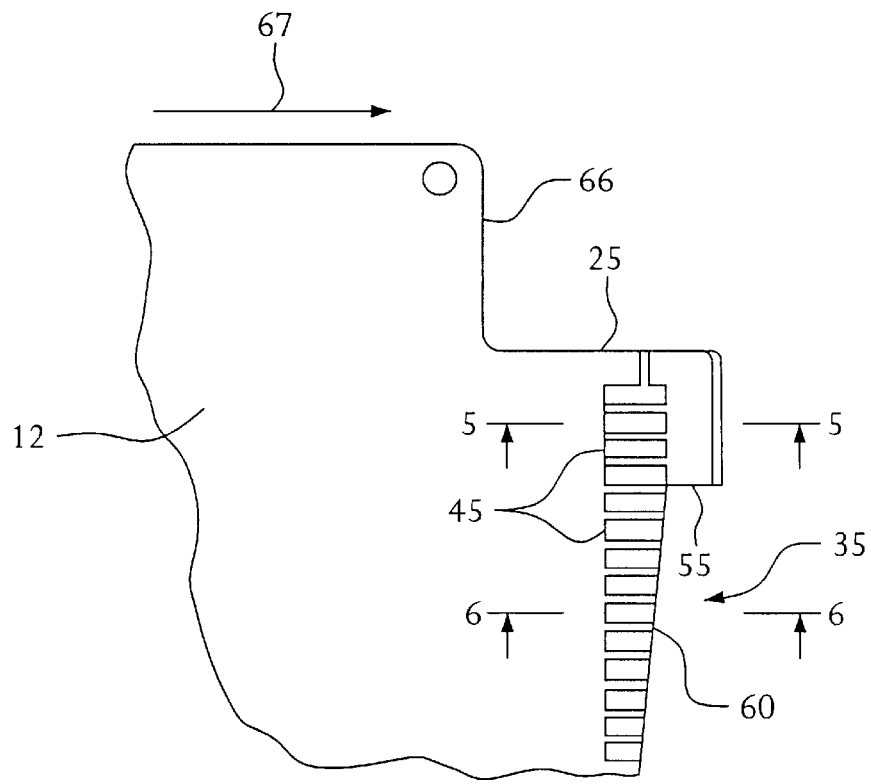
FIG. 4

PLUG-IN CIRCUIT BOARD WITH REDUCED INSERTION FORCE

The present invention claims the benefit under 35 U.S.C. §119(e) of a U.S. provisional application of Paul Bock, Jr. et al. entitled "Plug-in Circuit Card With Reduced Insertion Force Feature", Ser. No. 60/154,320, filed Sep. 17, 1999, the entire contents of which are expressly incorporated herein by reference.

BACKGROUND OF THE INVENTION

1. Field of the Invention The present invention relates to a plug-in circuit board that is receivable in an electrical socket or receptacle. More particularly, the present invention relates to a male connector portion of such a circuit board that can be inserted into female shorting contacts contained in the socket or receptacle.

2. Description of the Related Art

Shorting contacts are electrical contacts that must, at any given time, either form a short circuit between the contacts or provide electrical contact with the connector portion of a plug-in circuit board that is inserted between the shorting contacts. In other words, it is undesirable to even momentarily open-circuit the shorting contacts while the circuit board is being inserted. Such an open-circuit condition, even if relatively brief, can cause disruptions in the operation of the electrical circuitry to which the shorting contacts are connected.

U.S. Pat. No. 5,088,931 to Niciolo et al., the entire contents of which are expressly incorporated herein by reference, addresses this problem by providing a notch in the connector portion of a plug-in circuit board so that the shorting contacts in the corresponding socket are not forced open until electrical contact is made with the circuit board. However, the Niciolo et al. patent does not address the problem of excessive insertion force that results when there are many shorting contacts which must engage the electrical contacts on the circuit board.

When inserting a plug-in circuit board into a socket or receptacle, it is desirable to have a low insertion force. Conventionally, the insertion edge of a circuit board is beveled to reduce insertion force when inserting the circuit board into the receptacle. Inserting a beveled card into a receptacle that has shorting contacts is problematic in that the shorting contacts are forced apart by the insulating material of the circuit board prior to connection to the metal contacts on the circuit board. Thus, beveling the insertion edge is not a solution to the problem of reducing insertion force when making contact with a large number of shorting contacts.

What is needed is a circuit board that can mate be connected to a large number of shorting contacts during insertion into a socket or receptacle without requiring that excessive insertion force be used. What is also needed is a circuit board that allows for sequential connections to be made between the electrical contacts on the circuit board and the shorting contacts of the socket or receptacle.

SUMMARY OF THE INVENTION

It is therefore an object of the present invention to overcome the problems that arise during insertion of a circuit board into a socket or receptacle when numerous shorting contacts are present in the receptacle.

It is also an object of the invention to provide a plug-in circuit board that will not disrupt the operation of electrical circuits in the connected equipment when numerous shorting contacts are being connected.

It is another object of the invention to provide a plug-in circuit board requiring low insertion force during insertion into a socket or receptacle when the socket or receptacle contains numerous shorting contacts.

It is yet another object of the invention to allow sequential electrical connections to be made between a plug-in circuit board and a socket or receptacle when numerous shorting contacts are involved.

It is still a further object of the invention to provide a plug-in circuit board that can be safely and easily installed and removed from a socket or receptacle that includes both shorting contacts and conventional contacts.

In accordance with one aspect of the present invention, a plug-in circuit board assembly comprises a circuit board made of an electrically insulating material with a plurality of electrical components mounted thereon, and a connector portion extending from one side of the circuit board and adapted to be inserted into a socket or receptacle when the circuit board assembly is moved in an insertion direction. The connector portion has a first insertion edge which extends substantially perpendicular to the insertion direction of the circuit board, and a second insertion edge which extends at an oblique angle with respect to the insertion direction of the circuit board. A first plurality of electrically conductive fingers are carried by the connector portion and extend toward the first insertion edge. A second plurality of electrically conductive fingers are also carried by the connector portion and extend toward the second insertion edge. The second insertion edge may be recessed with respect to the first insertion edge. The first insertion edge is preferably beveled, and the second insertion edge is preferably not beveled. The oblique angle is preferably between about 5 and 10 degrees. Preferably, at least one of the first plurality of conductive fingers does not extend to the first insertion edge, whereas each of the second plurality of electrically conductive fingers preferably extends to the second insertion edge. The connector portion may be integral with the circuit board, and a faceplate may be connected to the side of the circuit board opposite the connector portion.

In accordance with a second aspect of the present invention, a plug-in circuit board assembly comprises a circuit board made of an electrically insulating material with a plurality of electrical components mounted thereon, and a connector portion extending from one side of the circuit board and adapted to be inserted into a socket or receptacle when the circuit board assembly is moved in an insertion direction. The connector portion has a pair of end sections with beveled insertion edges that extend substantially perpendicular to the insertion direction of the circuit board, and a cut-out section located between the end sections. The cut-out section has at least one non-beveled insertion edge that extends at an oblique angle with respect to the insertion direction of the circuit board. A first plurality of electrically conductive fingers carried by the connector portion extends toward the beveled insertion edges of the end sections. A second plurality of electrically conductive fingers carried by the connector portion extends toward the non-beveled insertion edge of the cut-out section. Preferably, the oblique angle between the non-beveled insertion edge of the cut-out section and the insertion direction of the circuit board is between about 5 and 10 degrees. It is also preferred that at least some of the first plurality of electrically conductive fingers do not extend to the beveled insertion edges of the end sections, and that each of the second plurality of conductive fingers extends to the non-beveled edge of the cut-out section. The connector portion is preferably integral with the circuit board. The cut-out section may have a pair of non-beveled insertion edges which extend at opposite oblique angles with respect to the insertion direction of the circuit board, thereby forming a generally V-shaped recess in the connector portion. A faceplate may be connected to the side of the circuit board opposite the connector portion.

BRIEF DESCRIPTION OF THE DRAWINGS

These and other objects, advantages and novel features of the present invention will be more readily appreciated from the following detailed description when read in conjunction with the accompanying drawings, in which:

FIG. 3 is a front view of the plug-in circuit board assembly of FIGS. 1 and 2;

FIG. 4 is a detailed view of part of the connector portion of the plug-in circuit board assembly shown in FIG. 2;

FIG. 7 is an enlarged schematic view of a pair of shorting contacts and a connected circuit;

DETAILED DESCRIPTION OF THE PREFERRED EMBODIMENTS

Figure 1:
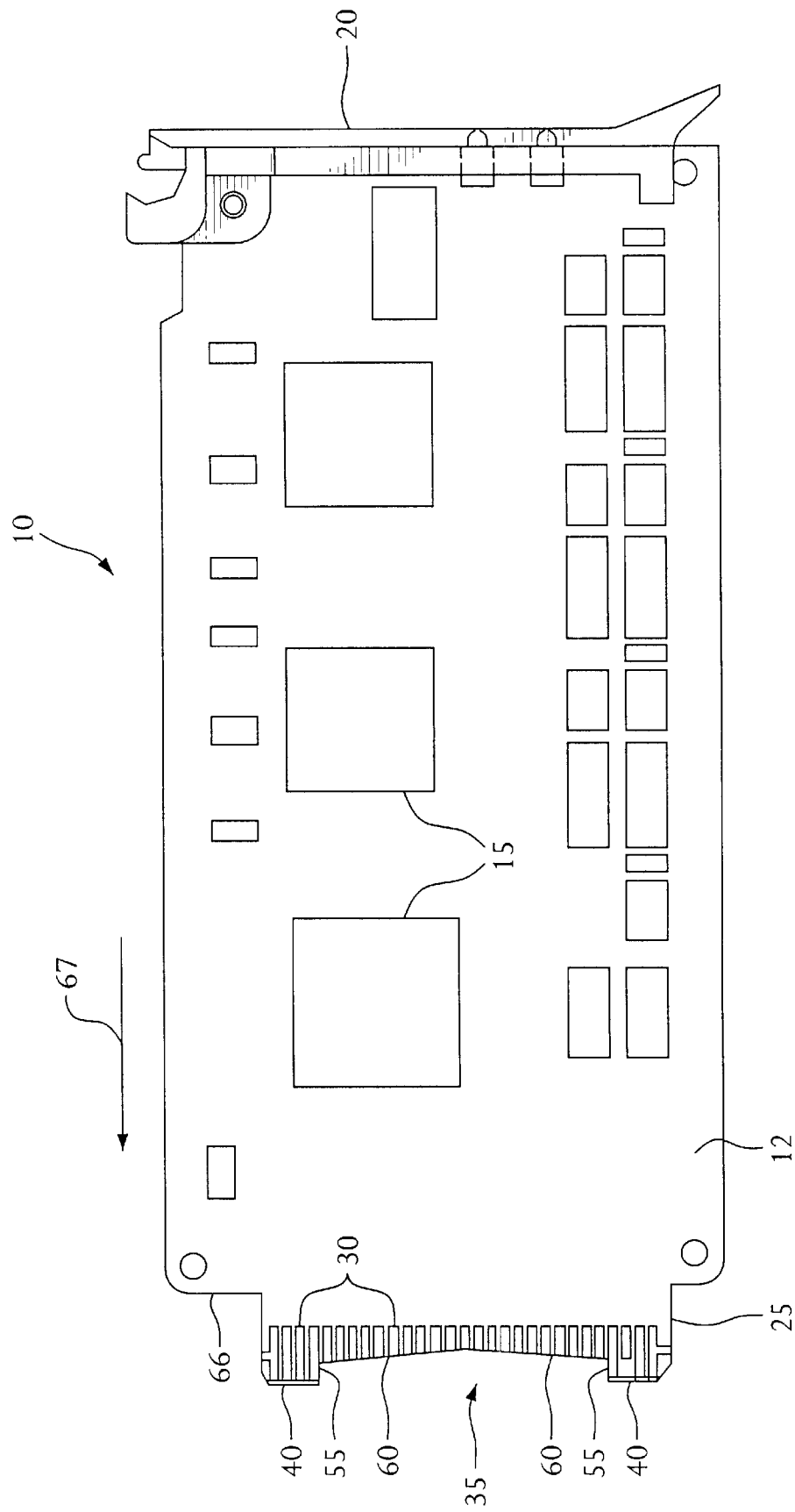
FIG. 1 is a left side view of a plug-in circuit board assembly according to a first embodiment of the present invention.

FIG. 1 illustrates the left-hand face of a plug-in circuit board assembly 10 according to a first embodiment of the present invention. Mounted on a generally rectangular, insulating circuit board 12 are integrated circuit (IC) devices 15 and other components that perform the electrical functions of the circuit board assembly 10. On one side of the circuit board 12 is a faceplate 20 that allows a user to grasp the circuit board assembly 10 during insertion and removal from a socket or receptacle. On the side of the circuit board 12 opposite the faceplate 20 is an integral connector portion 25 that forms an electrical connection to a socket or receptacle (not shown in FIG. 1). The connector portion 25 of the circuit board 12 carries a set of conductive fingers 30 that extend toward the edge of the connector portion 25 for electrical connection to contacts carried in the socket or receptacle. In the embodiment shown in FIG. 1, the connector portion 25 of the circuit board 12 includes a non-beveled V-shaped cut-out 35 as well as beveled straight portions 40. The electrically conductive fingers 30 within the beveled portions 40 connect to conventional (i.e., open or non-shorting) contacts in the receptacle when circuit board 10 assembly is inserted into the receptacle. Some of the electrically conductive fingers 30 may terminate a short distance before the bevel in the areas of the connector portion 25 outside the V-shaped cut-out 35. This distance may vary for each electrically conductive finger 30 to provide the desired sequence of electrical connections when the circuit board assembly is inserted into the receptacle. The electrically conductive fingers 30 located within the V-shaped cut-out 35 electrically connect to shorting contacts in the receptacle. The electrically conductive fingers 30 within the V-shaped cut-out 35 extend all the way to the edge of the connector portion 25. As noted above, the edge of the connector portion 25 within the V-shaped cut-out 35 is not beveled.

Figure 2:
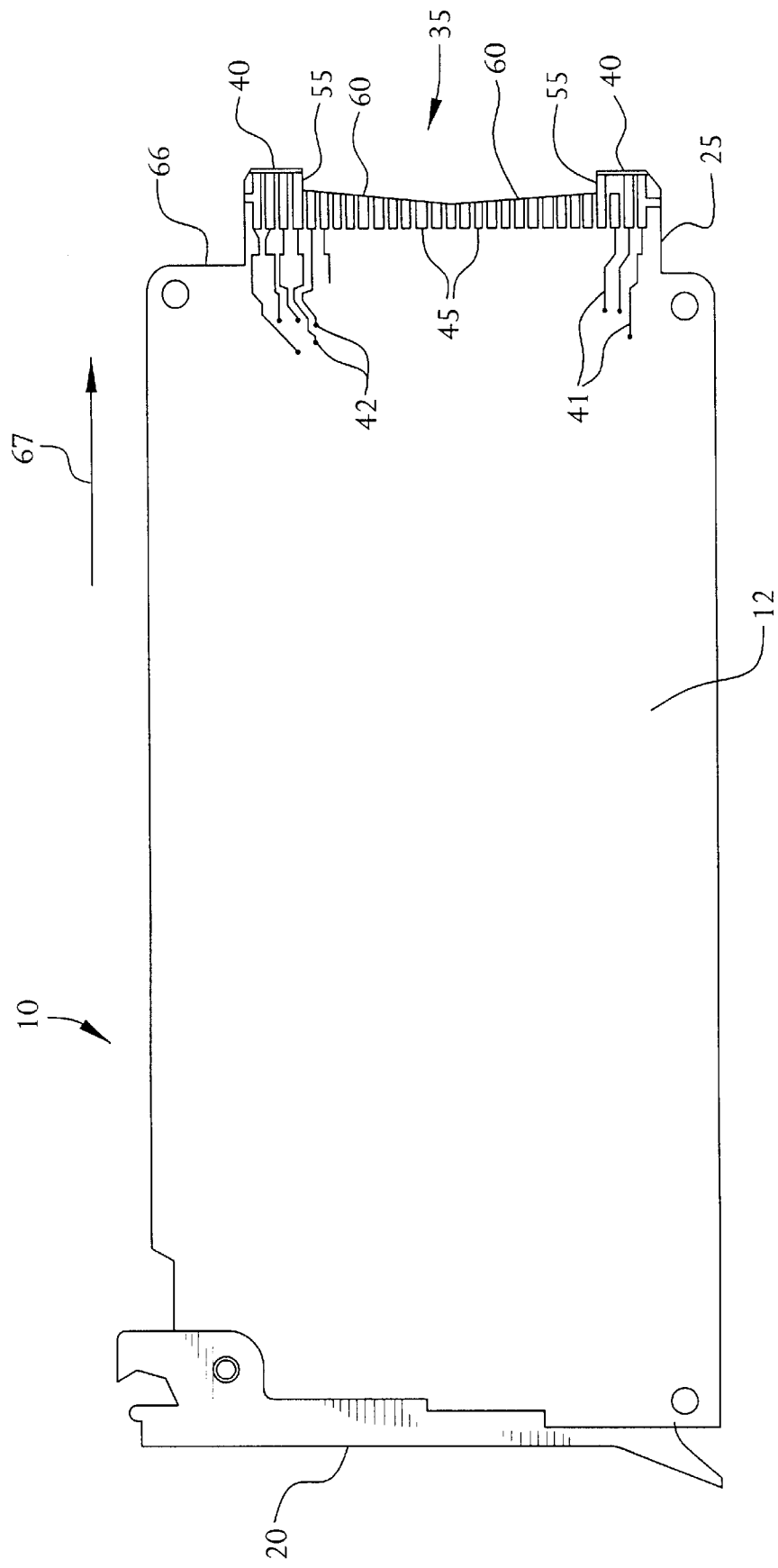
FIG. 2 is a right side view of the plug-in circuit board assembly of FIG. 1.

FIG. 2 illustrates the right-hand face of the circuit board assembly 10 shown in FIG. 1. On this surface, the circuit board 12 includes printed metallic connections 41 and component mounting holes 42 but does not contain IC devices or other electrical components. The corresponding surface of the connector portion 25 contains a second set of electrically conductive fingers 45 which are electrically separate from the first set of conductive fingers 30 illustrated in FIG. 1. Therefore, the electrically conductive fingers 45 may terminate at different distances from the beveled edges 40 than the corresponding electrically conductive fingers 30 on the opposite face of the circuit board. However, as in the case of FIG. 1, the electrically conductive fingers 45 within the V-shaped cut-out 35 extend all the way to the edge of the connector portion 25 without any bevel.

FIG. 3 illustrates the front of the faceplate 20 that is affixed to the side of circuit board 12 opposite the connector portion 25. The faceplate 20 is substantially wider than the remainder of circuit board 12, allowing the user to grasp the circuit board assembly 10 and provide the force necessary to insert the circuit board assembly 10 into a socket or receptacle. The faceplate 20 also allows the user to grasp the circuit board assembly 10 during removal of the circuit board assembly 10 from the receptacle. On the faceplate 20 are one or more light emitting diodes (LEDs) 50 to indicate the electrical status of the circuit board assembly 10 after the circuit board assembly 10 is inserted into the socket or receptacle.

FIG. 4 is an enlarged view of a part of the right-hand face of the connector portion 25 of the circuit board assembly 10 shown in FIG. 1 (the left-hand face is essentially the same). On the part of the connector portion 25 shown in FIG. 4, the conductive fingers 45 terminate at a distance inward from the insertion edge of the beveled portion 40. On the part of the connector portion 25 opposite to that shown in FIG. 4, the beveled portion 40 has conductive fingers 45 terminating at varying distances inward from the insertion edge of the connector portion 25 (this can be seen at the bottom of FIGS. 1 and 2). This allows for sequential electrical coupling between the conductive fingers 45 of the beveled portion 40 and the corresponding non-shorting contacts of the receptacle, as may be necessary to meet the timing requirements of the circuitry on the circuit board 12. Unlike the beveled portions 40, the electrically conductive fingers 45 within V-shaped cut-out 35 extend all the way to the edge of the connector portion 25. In addition, no bevel exists along the insertion edge of the connector portion 25 within the V-shaped cut-out 35. This is due to the fact that the electrically conductive fingers 45 within the V-shaped cut-out 35 are required to electrically connect to the respective shorting contacts in the receptacle before the shorting contacts separate from each other. In the illustrated embodiment, the V-shaped cut-out 35 is defined by a recess 55 and by two straight, angled portions 60. Each of the angled portions 60 preferably forms an angle of between about 5 to 10 degrees with respect to the beveled insertion edges 40. The insertion edges 40 extend parallel to the side 66 of the circuit board 12 and perpendicular to its insertion direction (the insertion direction is represented by the arrow 67 in FIGS. 1, 2 and 4). The angled portions 60 reduce the required insertion force when electrical contact is being made to numerous shorting contacts, because not all of the shorting contacts have to connect to their respective conductive fingers 45 at the same time. Instead, the shorting contacts connect to the electrically conductive fingers 45 sequentially, thus preventing a large insertion force from being required at any one time during insertion of the circuit board assembly 10.

Figure 5:
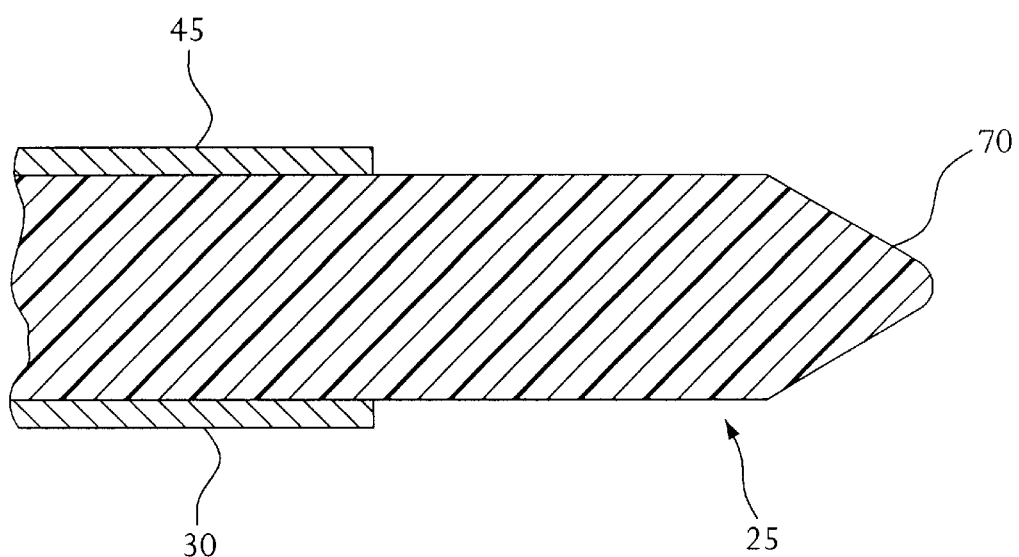
FIG. 5 is an enlarged cross-sectional view showing a beveled edge region of the connector portion in FIG. 4.

FIG. 5 illustrates a cross-section of the beveled edge portion 40 illustrated in FIG. 4. Two electrically conductive fingers 30 and 45 are illustrated, since both the left and right faces of the connector portion 25 carry electrically conductive fingers. In other areas of the connector portion 25, the electrically conductive fingers 30 and 45 terminate at or close to the bevel 70, where the electrically insulating material of circuit board 12 is exposed. However, in the area shown in FIG. 5, the electrically conductive fingers 30 and 45 terminate a distance behind the bevel 70. This distance allows sequential electrical connections to be made. The bevel 70 allows for reduced insertion force into conventional (non-shorting) contacts in a receptacle. The arrangement shown in FIG. 5 would not be effective if inserted into shorting contacts because the bevel 70, which is made of electrically insulating material, would come into contact with and separate the shorting contacts before the electrically conductive fingers 30 and 45 (even if they extend to the edge of the bevel 70) could make electrical contact with their respective shorting contacts.

Figure 6:
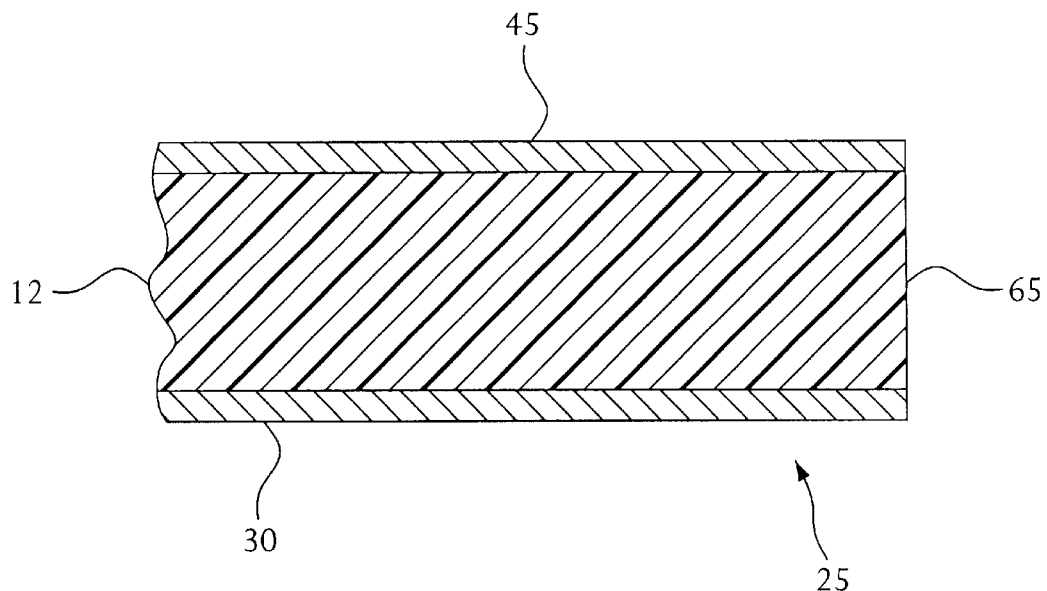
FIG. 6 is an enlarged cross-sectional view showing a non-beveled edge region in the connector portion of FIG. 4.

FIG. 6 is a cross-sectional view of the connector portion 25 within the V-shaped cut-out 35. FIG. 6 illustrates the electrically conductive fingers 30 and 45 extending entirely out to the edge 65 of the connector portion 25. In addition, there is no bevel at the edge 65 of the V-shaped cut-out 35. The arrangement shown in FIG. 6 is suitable for insertion into shorting contacts within a receptacle because the electrically conductive fingers 30 and 45 will electrically contact the shorting contacts before the shorting contacts are opened.

FIG. 7 illustrates a closed set of shorting contacts 72 of the type typically found in a socket or receptacle. Shorting contacts 72 comprise a first flexible metallic contact 75 and a second flexible metallic contact 80. As illustrated in FIG. 7, the first metallic flexible contact 75 is in electrical contact with the second metallic flexible contact 80. This electrical contact must not be interrupted unless the corresponding electrically conductive fingers 30 and 45 of the circuit board assembly 10 first make contact with both the first flexible metallic contact 75 and the second flexible metallic contact 80, respectively. If the first flexible metallic contact 75 separates from the second flexible metallic contact 80 prior to establishing electrical contact with electrically conductive fingers 30 and 45, the operation of circuit 85 could become disrupted. The arrangement shown in FIG. 5 would be unsuitable for connecting to the shorting contacts 72 in FIG. 7 because the bevel 70, which is made of an electrically insulating material, would separate the first flexible metallic contact 75 from the second flexible metallic contact 80 prior to electrical contact with both electrically conductive fingers 30 and 45, respectively. This would be even if the conductive fingers 30 and 45 extended to the edge of the bevel 70 in FIG. 5. This problem does not occur with the arrangement shown in FIG. 6, since the bevel 70 is omitted.

Figure 8:
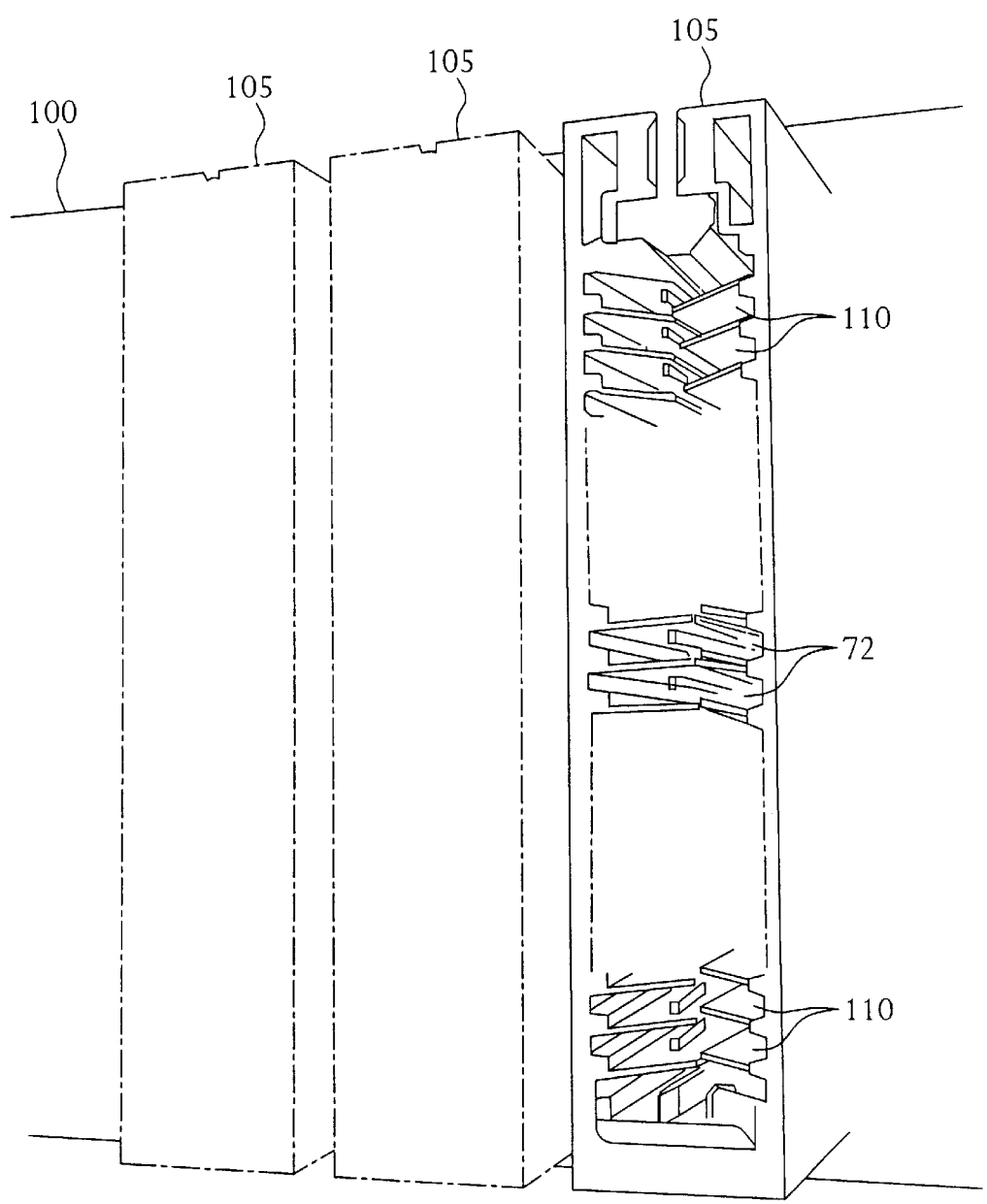
FIG. 8 is a perspective view of a back panel with several sockets or receptacles that include both shorting and non-shorting contacts.

FIG. 8 illustrates a chassis back panel 100 which comprises several sockets or receptacles 105. Each receptacle 105 comprises four conventional (open) contact sets 110 at each end of the receptacle 105 for electrical connection to the sixteen metallic contact fingers 30 and 45 in the beveled areas 40 of the connector portion 25. Between the two groups of conventional contact sets 110 are numerous shorting (closed) contact sets 72 for connecting to the metallic contact fingers 30 and 45 adjoining the V-shaped cut-out 35 of the connector portion 25. All of the conventional contact sets 110 and all of the shorting contact sets 72 lie along a single vertical plane. This allows for sequential connections when the metallic contact fingers on a circuit board that is to be inserted into the receptacle terminate at varying distances from the insertion edge and/or when the connector portion contains a cut-out section.

Figure 9:
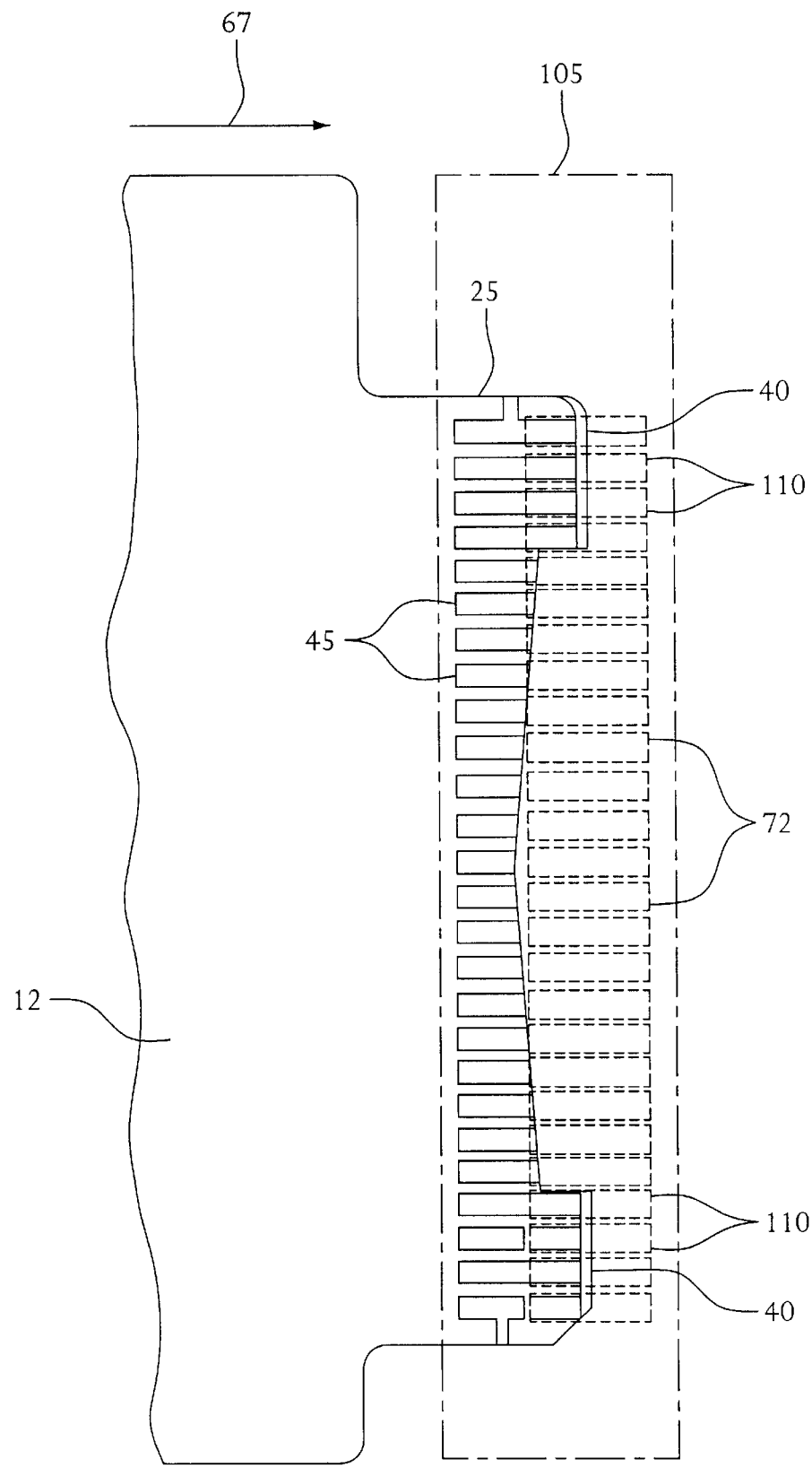
FIG. 9 is a schematic view illustrating the circuit board of FIGS. 1–6 partially inserted into one of the receptacles of FIG. 8.

FIG. 9 illustrates the circuit board 10 partially inserted into a receptacle 105 of the back panel 100. In FIG. 9, the beveled portions 40 of the connector portion 25 are in contact with conventional contacts 110 of the receptacle 105. Electrically conductive fingers 45 (and electrically conductive fingers 30, not shown, on the opposite face of the connector portion 25) that terminate at or near a beveled edge 40 of connector portion 25 are in electrical contact with conventional contacts 110. However, because the connector portion 25 has a V-shaped cut-out 35, some of the electrically conductive fingers 45 and 30 that terminate within the V-shaped cut-out 35 are not yet in electrical contact with their corresponding shorting contacts 72. As can be seen from FIG. 9, the electrically conductive fingers 45 and 30 that terminate within the V-shaped cut-out 35 of the connector portion 25 of the circuit board 10 are connected sequentially to the shorting contacts 72 as the circuit board 10 is progressively inserted into the receptacle 105. Since the shorting contacts 72 must be forced apart without the assistance of a beveled insertion edge to connect to the electrically conductive fingers 45 and 30, it can require substantial insertion force to insert the circuit board 12 into the socket 105. Therefore, as shown in FIG. 9, the electrically conductive fingers 30 and 45 are connected sequentially, rather than all at once, to the shorting contacts 72 to reduce the insertion force and spread the insertion force out over time.

Figure 10:
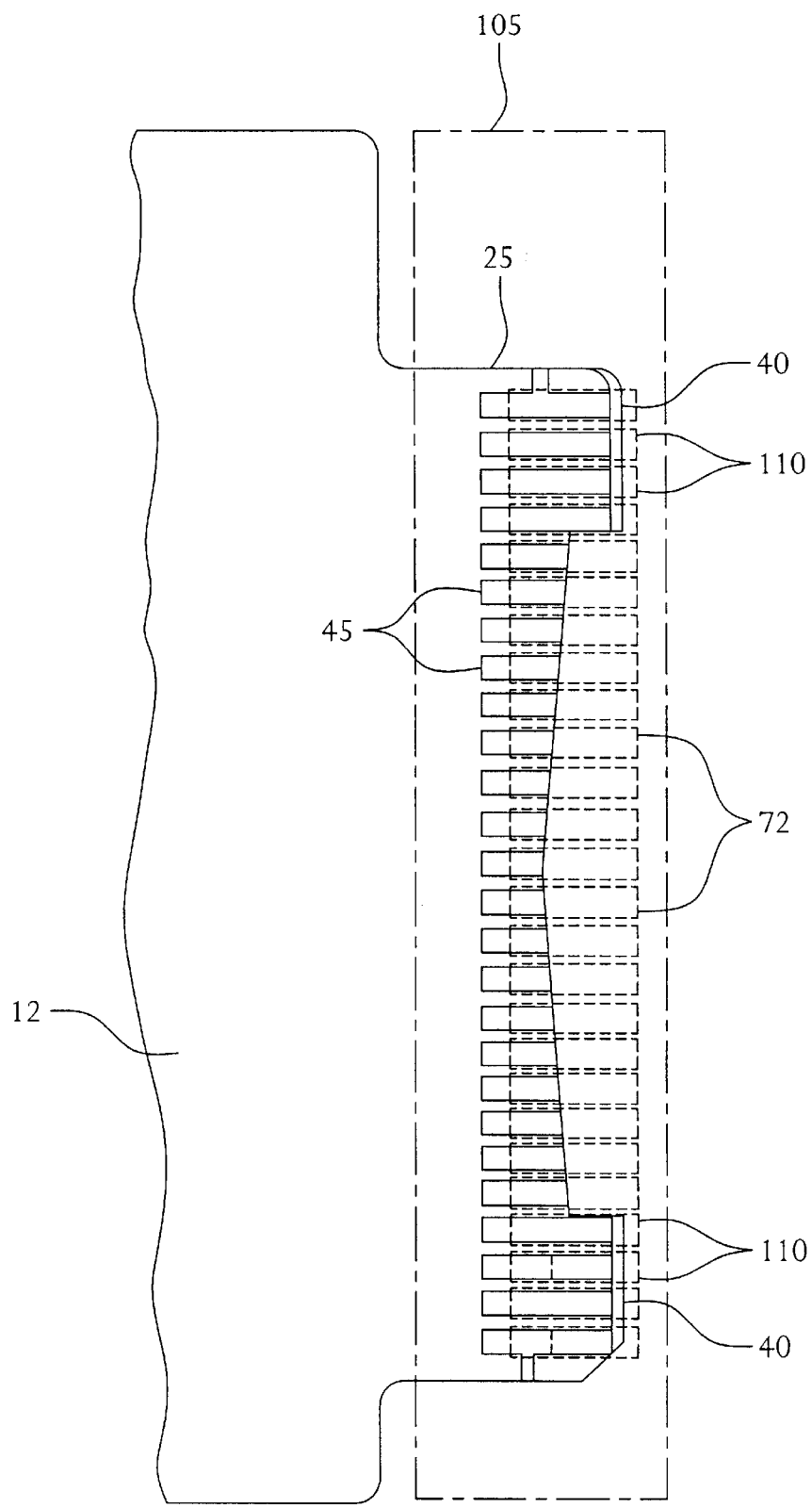
FIG. 10 is a schematic view illustrating the circuit board of FIGS. 1–6 fully inserted into one of the receptacles of FIG. 8.

FIG. 10 illustrates the circuit board 10 fully inserted into the receptacle 105. Each of the conductive fingers 45 and 30 adjoining the V-shaped cut-out 35 of the connector portion 25 is now electrically connected to one of a corresponding pair of shorting contacts 72. The conductive fingers 30 within the V-shaped cut-out 35 on the left face of circuit board 10 are in electrical contact with flexible metallic contacts 75 of shorting contacts 72, and the conductive fingers 45 within the V-shaped cut-out 35 on the right face of circuit board 10 are in electrical contact with flexible metallic contacts 80 of shorting contacts 72. Electrical contact to the shorting contacts 72 has been made without separating the flexible metallic contacts 75 from the flexible metallic contacts 80 prior to contact with the conductive fingers 30 and 45, respectively. Also, insertion of circuit board assembly 10 into the receptacle 105 has been accomplished without excessive insertion force.

Figures 11, 12:
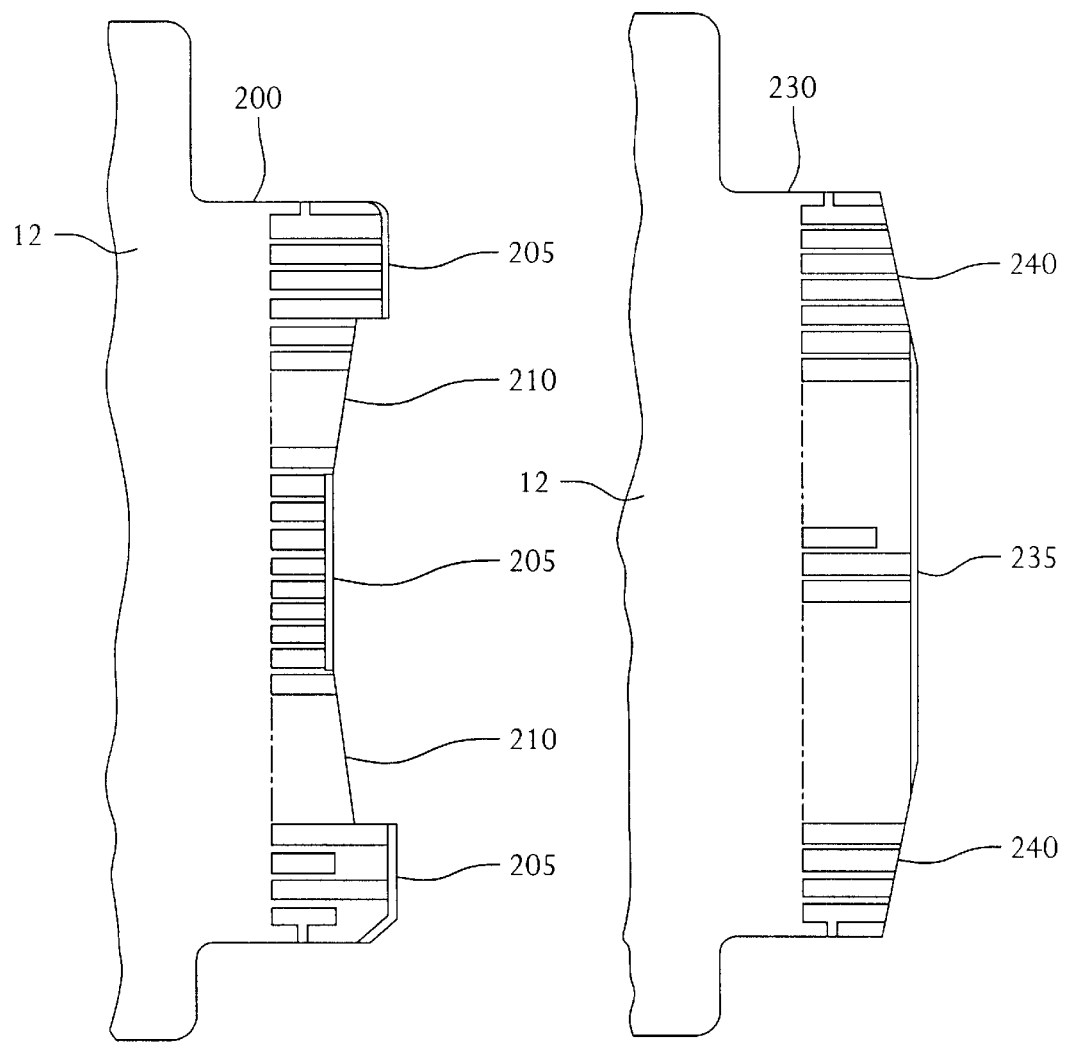
FIG. 11 illustrates the connector portion of a plug-in circuit board according to a second embodiment of the present invention.
FIG. 12 illustrates the connector portion of a plug-in circuit board according to a third embodiment of the present invention.

The present invention is not limited to the circuit board design shown in FIGS. 1–6. FIG. 11 illustrates a connector portion 200 according to a second embodiment of the present invention. In FIG. 11, the connector portion 200 has a modified V-shaped cut-out area There are two angled regions 210 that have a cross-section similar to FIG. 6 and that connect to shorting contacts similar to those shown in FIG. 7. However, there are three regions 205 having beveled edges, each with a cross-section similar to that shown in FIG. 5, that connect to conventional (open) contacts. One of the three regions 205 is located between the two angled regions 210 that make contact with the shorting contacts.

FIG. 12 illustrates a third embodiment of the present invention. The connector portion 230 comprises a central beveled portion 235 for making electrical connection to conventional contacts in the receptacle. On either side of beveled portion 235 are angled portions 240 that are designed to make contact with shorting contacts in the receptacle. A cross-section through beveled portion 235 would resemble FIG. 5, and a cross-section through either one of the angled portions 240 would resemble FIG. 6. As with the embodiments of FIGS. 1–6 and 11, sequential electrical coupling as well as low insertion force can be achieved. In the arrangement of FIG. 12, the shorting contacts are located at the ends of the receptacle and conventional contacts are located in the middle of the receptacle.

Other embodiments of the present invention are also possible. For example, the cutout section 35 of the connector portion 25 in FIGS. 1, 2 and 4 may have curved edges rather than the straight edges shown. Similarly, the portions 210 in FIG. 11 and the portions 240 in FIG. 12 may be curved rather than straight.

While preferred embodiments of the present invention have been set forth with particularity, it is to be understood that various changes and substitutions are possible without departing from the scope of the claimed invention as set forth in the following claims.

What is claimed is:

1. A plug-in circuit board assembly comprising:
   a circuit board made of an electrically insulating material and having a plurality of electrical components mounted thereon;
   a connector portion extending from one side of said circuit board and adapted to be inserted into a socket or receptacle when said circuit board assembly is moved in an insertion direction, said connector portion having a first insertion edge extending substantially perpendicular to said insertion direction and a second insertion edge extending at an oblique angle with respect to said insertion direction;
   a first plurality of electrically conductive fingers carried by said connector portion and extending toward said first insertion edge; and
   a second plurality of electrically conductive fingers carried by said connector portion and extending toward said second insertion edge and being substantially parallel to said first plurality of electrically conductive fingers.

2. A plug-in circuit board assembly as claimed in claim 1, wherein said second insertion edge is recessed with respect to said first insertion edge.

3. A plug-in circuit board assembly as claimed in claim 1, wherein said first insertion edge is beveled.

4. A plug-in circuit board assembly as claimed in claim 1, wherein said second insertion edge is not beveled.

5. A plug-in circuit board assembly as claimed in claim 1, wherein said first insertion edge is beveled and said second insertion edge is not beveled.

6. A plug-in circuit board assembly as claimed in claim 1, wherein said oblique angle is between about 5 and 10 degrees.

7. A plug-in circuit board assembly as claimed in claim 1, where at least one of said first plurality of conductive fingers does not extend to said first insertion edge.

8. A plug-in circuit board assembly as claimed in claim 1, wherein each of said second plurality of electrically conductive fingers extends to said second insertion edge.

9. A plug-in circuit board assembly as claimed in claim 1, wherein said connector portion is integral with said circuit board.

10. A plug-in circuit board assembly as claimed in claim 1, further comprising a faceplate connected to the side of said circuit board opposite said connector portion.

11. A plug-in circuit board assembly comprising:
    a generally rectangular circuit board made of an electrically insulating material and having a plurality of electrical components mounted thereon;
    a connector portion extending from one side of said circuit board for insertion into a socket or receptacle when said circuit board assembly is moved in an insertion direction, said connector portion having a pair of end sections having beveled insertion edges extending substantially perpendicular to said insertion direction and a cut-out section located between said end sections, said cut-out section having at least one non-beveled insertion edge extending at an oblique angle with respect to said insertion direction;
    a first plurality of electrically conductive fingers carried by said connector portion and extending toward said beveled insertion edges of said end sections; and
    a second plurality of electrically conductive fingers carried by said connector portion and extending toward said non-beveled insertion edge of said cut-out section.

12. A plug-in circuit board assembly as claimed in claim 11, wherein said oblique angle is between about 5 and 10 degrees.

13. A plug-in circuit board assembly as claimed in claim 11, wherein at least one of said first plurality of electrically conductive fingers does not extend to a beveled insertion edge of an end section.

14. A plug-in circuit board assembly as claimed in claim 11, wherein each of said second plurality of conductive fingers extends to said non-beveled insertion edge of said cutout section.

15. A plug-in circuit board assembly as claimed in claim 11, wherein said connector portion is integral with said circuit board.

16. A plug-in circuit board assembly as claimed in claim 11, wherein said cut-out section has a pair of non-beveled insertion edges extending at opposite oblique angles with respect to said insertion direction to form a generally V-shaped recess in said connector portion.

17. A plug-in circuit board assembly as claimed in claim 11, further comprising a faceplate connected to the side of said circuit board opposite said connector portion.

* * * * *